United States Patent [19]
Schorn

[11] Patent Number: 5,461,331
[45] Date of Patent: Oct. 24, 1995

[54] DYNAMIC TO STATIC LOGIC TRANSLATOR OR PULSE CATCHER

[75] Inventor: Eric B. Schorn, Austin, Tex.

[73] Assignee: International Business Machines Corporation, Armonk, N.Y.

[21] Appl. No.: 282,143

[22] Filed: Jul. 28, 1994

[51] Int. Cl.[6] .................. H03K 19/0175; H03K 19/02
[52] U.S. Cl. .................. 326/83; 327/206; 327/210
[58] Field of Search .................. 326/83; 327/205, 327/206, 208, 210, 211, 212, 18, 22, 23, 24, 31

[56] References Cited

U.S. PATENT DOCUMENTS

| | | | |
|---|---|---|---|
| 3,493,785 | 2/1970 | Rapp | 327/210 |
| 4,506,168 | 3/1985 | Uya | 327/206 |
| 4,594,519 | 6/1986 | Ohtani et al. | |
| 4,607,173 | 8/1986 | Knoedl, Jr. | |
| 4,616,148 | 10/1986 | Ochi et al. | 327/206 |
| 4,728,820 | 3/1988 | Lee | |
| 4,800,300 | 1/1989 | Walters, Jr. | 327/210 |
| 4,808,840 | 2/1989 | Chung et al. | |

Primary Examiner—Edward P. Westin
Assistant Examiner—Richard Roseen
Attorney, Agent, or Firm—Mark E. McBurney

[57] ABSTRACT

A system and method is provided which includes a set of N and P type transistors connected such that both positive active and negative dynamic logic input pulses may be received. The pulse catcher circuit of the present invention then outputs a static logic level based upon the input pulses. A first input circuit is included that receives the data signal and outputs a level (voltage or absence of a voltage) to an output invertor circuit which is used in conjunction with a feedback circuit as a latch to maintain the output at the desired level. The feedback circuit ensures that the level will be maintained in a stable state (i.e. ground potential for a logical "0" and Vdd for a logical "1"). In this manner the static logic levels output from the circuit will be maintained until another dynamic pulse is received. Additionally, the pulse catcher circuit will always provide a consistent static logic output, even when both of the dynamic logic input signals are in their active states.

8 Claims, 6 Drawing Sheets

DYNAMIC TO STATIC LOGIC TRANSLATOR OR PULSE CATCHER

BACKGROUND OF THE INVENTION

1. Field of the Invention

The present invention relates to a circuit which converts pulsed logic signals into static logic signals. More particularly, the invention allows both positive active pulsed signals (active high) and negative active pulsed signals (active low) to be input to a single circuit without the necessity of an inverter to change the signals when the activation levels are not the same.

2. Description of Related Art

Pulse catcher circuits are generally used in computer systems to receive a pulse from a logical component using dynamic (pulsed) logic circuit. These pulse catchers then output a static signal to static logic devices. In this manner, dynamic logic devices can be connected to static logic devices. Those skilled in the art will understand that data signals in a dynamic logic system are in the form of a pulse, either positive active (active when a voltage is present) or negative active (active when a voltage is not present). On the other hand, static devices recognize data as a level, either the presence of a voltage, or the absence of a voltage.

Typically, dynamic devices are faster and more complex than static devices, and take a longer time to design and test. Dynamic devices are normally used for complex (i.e. "deep" logic containing multiple levels) and critical system components, such as a "multiplier" circuit, or the like. Static devices are more easily and quickly designed, but are also much slower and often used for less complex and critical components, such as a single "or" gate surrounded by latches. Thus, it can be seen how a computer system will likely include both dynamic and static devices, depending on the complexity of the design.

Thus, it can be seen that the pulse catcher is a valuable component in a computer system which receives a pulse from a dynamic device and creates a static level which is output to the static device and maintained until another pulse is received from the dynamic device.

Normally, pulse catcher circuits are based upon a set/reset latch that require active high inputs or active low inputs exclusively, but not both, i.e. they cannot be mixed. For example, U.S. Pat. No. 4,607,173 shows a circuit with cross coupled NAND or NOR gates which receive inputs S and R which are either negative active or positive active, but not both. Further, if the inputs to this type of circuit are both active it may cause both of the outputs to be equal, which is not acceptable in many applications for a set/reset (flip-flop) device.

U.S. Pat. No. 4,728,820 describes a logic transition detection circuit that uses an inverter to allow both a positive and negative active signal to be input to the circuit. However, utilizing an inverter at the input of the transition circuit causes gate delay and performance degradation.

Additionally, circuits are known which use a pair of "strong" transistors as set/reset elements connected to a pair of "weak" inverters used as storage elements. In this case when both inputs are active a resistive connection between Vdd and ground exists which causes a great deal of current to be pulled and associated heating to occur. If the outputs of this circuit are taken from the weak inverters, external coupling noise can easily cause the inverters to erroneously change states. If the outputs are buffered the propagation delay is increased. Furthermore, this type of circuit will also give uncertain outputs when both of the inputs are active, i.e. the outputs may be equal.

Therefore, it can be seen that a circuit which will provide consistent set/reset output signals under all combinations of inputs and allow for a mixed input of positive active and negative active signals would be highly desirable for use as a pulse catcher.

SUMMARY OF THE INVENTION

In contrast to the prior art, the present invention provides a pulse catcher which converts dynamic logic signals to static logic signals wherein both positive active and negative active signals may be input. Further, the present invention will always provide consistent outputs regardless of whether both of the input signals are in their active state.

Broadly, the present invention includes a set of N and P type transistors connected such that both positive active and negative dynamic logic input pulses may be received. The pulse catcher circuit of the present invention then outputs a static logic level based upon the input pulses. A first input circuit is included that receives the data signal and outputs a level (voltage or absence of a voltage) to an output invertor circuit which is used in conjunction with a feedback circuit as a latch to maintain the output at the desired level. This latching arrangement ensures that the level will be maintained in a stable state (i.e. ground potential for a logical "0" and Vdd for a logical "1"). In this manner the static logic levels output from the circuit will be maintained until another dynamic pulse is received.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
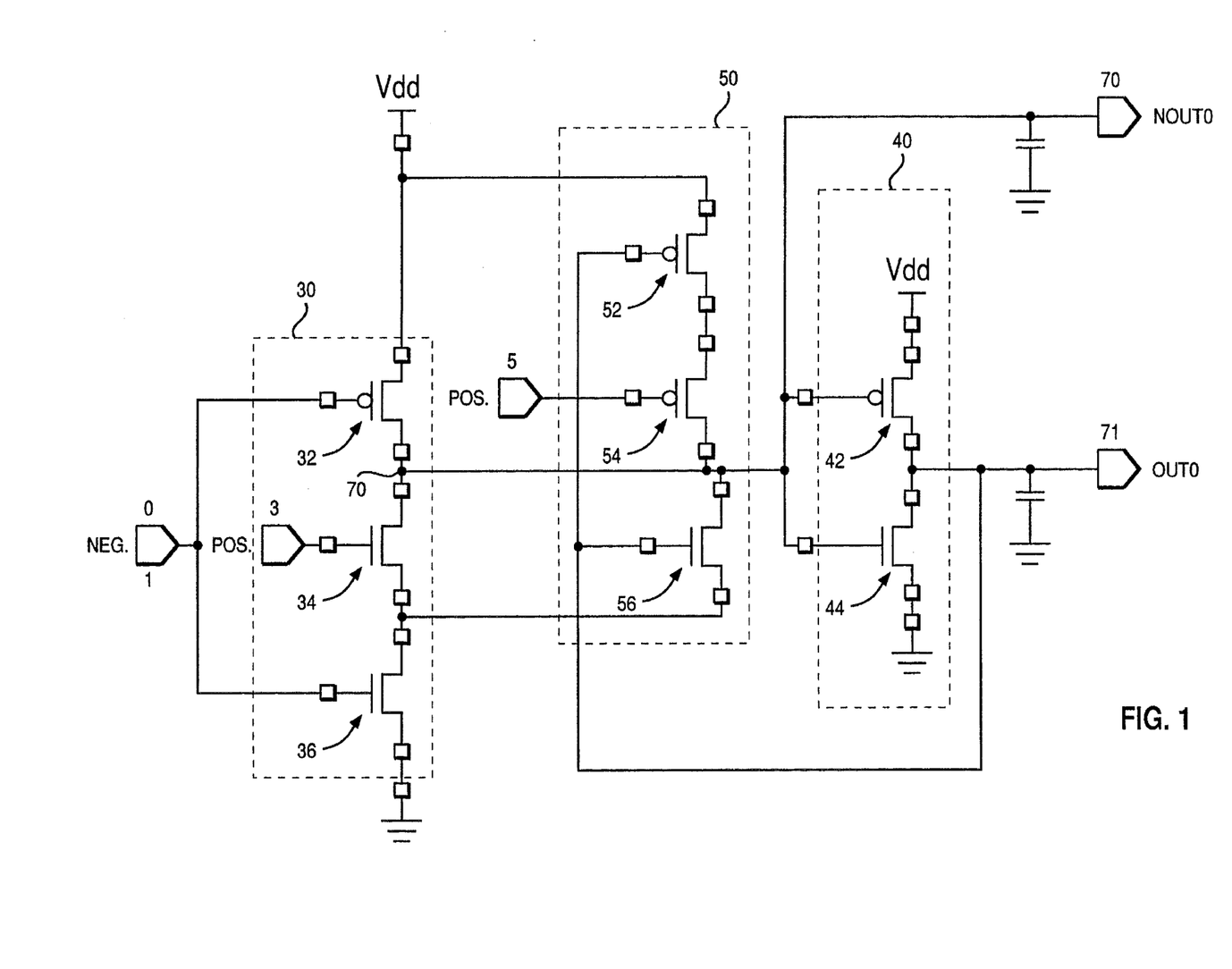
FIG. 1 is a schematic diagram of a pulse catcher circuit in which a negative active signal is dominant.

Referring to FIG. 1, a first embodiment of the present invention is shown wherein the output of the circuit is dominated by the negative active input. More particularly, input 1 will receive the negative active signal and inputs 3 and 5 will receive the positive active signal. Circuit 30 includes "P" type transistor 32 and "N" type transistors 34 and 36. Those skilled in the art will understand that N type transistors are turned on when there is a voltage, Vdd, applied to their gate, while P type transistors are turned on when there is no voltage (or a reference voltage less than Vdd) applied to the gate.

Circuit 50 includes P type transistors 52 and 54, along with N type transistor 56. Output circuit 40 is essentially an inverter and contains P type transistor 42 and N type transistor 44. Node 71 provides the output from the circuit of FIG. 1. It should be noted that node 71 has been chosen as the output of the circuit, with node 70 considered the opposite of the output, i.e. if node 71 is a logical "1", then node 70 is a logical "0" and vice versa. Further, the presence of the voltage Vdd on a particular node in the circuits of the present invention will be considered to be a logical "1" and the reference, or ground potential will be considered to be a logical "0".

The operation of the present invention as embodied by the circuit of FIG. 1 will now be described in conjunction with the timing diagrams of FIGS. 3 and 4. This circuit is a pulse catcher and a dynamic logic circuit will be connected to input terminals 1, 3 and 5, with the static logic output being provided to the static circuit via nodes 70 and 71. At point A on FIG. 3 the circuit of FIG. 1 is considered to be in a hold state. The positive input is a "0" and the negative input is "1". In this case both of the inputs are inactive. At this point, a "1" is present at output 70 and a "0" is present at output 71. The "1" input to the negative input terminal 1 is provided to transistors 32 and 36 (T32 and T36). Since T32 is a P type device the logical "1" will keep it turned off. T36 is a N type device and is turned on and will conduct between is source and drain. The "0" input on positive node 3 will maintain T34 in a turned off state, while the "0" input on positive node 5 will turn T54 on such that it will conduct between its source and drain. As noted above output node 71 is at a logical "0" state. This "0" is provided as feedback to T52 such that it will conduct. Thus, node 70 is at the same potential as Vdd, due to the connection from Vdd, T52 and T54. Further, node 70 is connected to circuit 40. Since this node is now at "1", T44 is turned on and will conduct, placing node 71 is ground potential. In this manner, the circuit of FIG. 1, will hold a logical 0 at the output node 71, and a logical 1 on the opposite ("not") output node 70.

Figure 3:
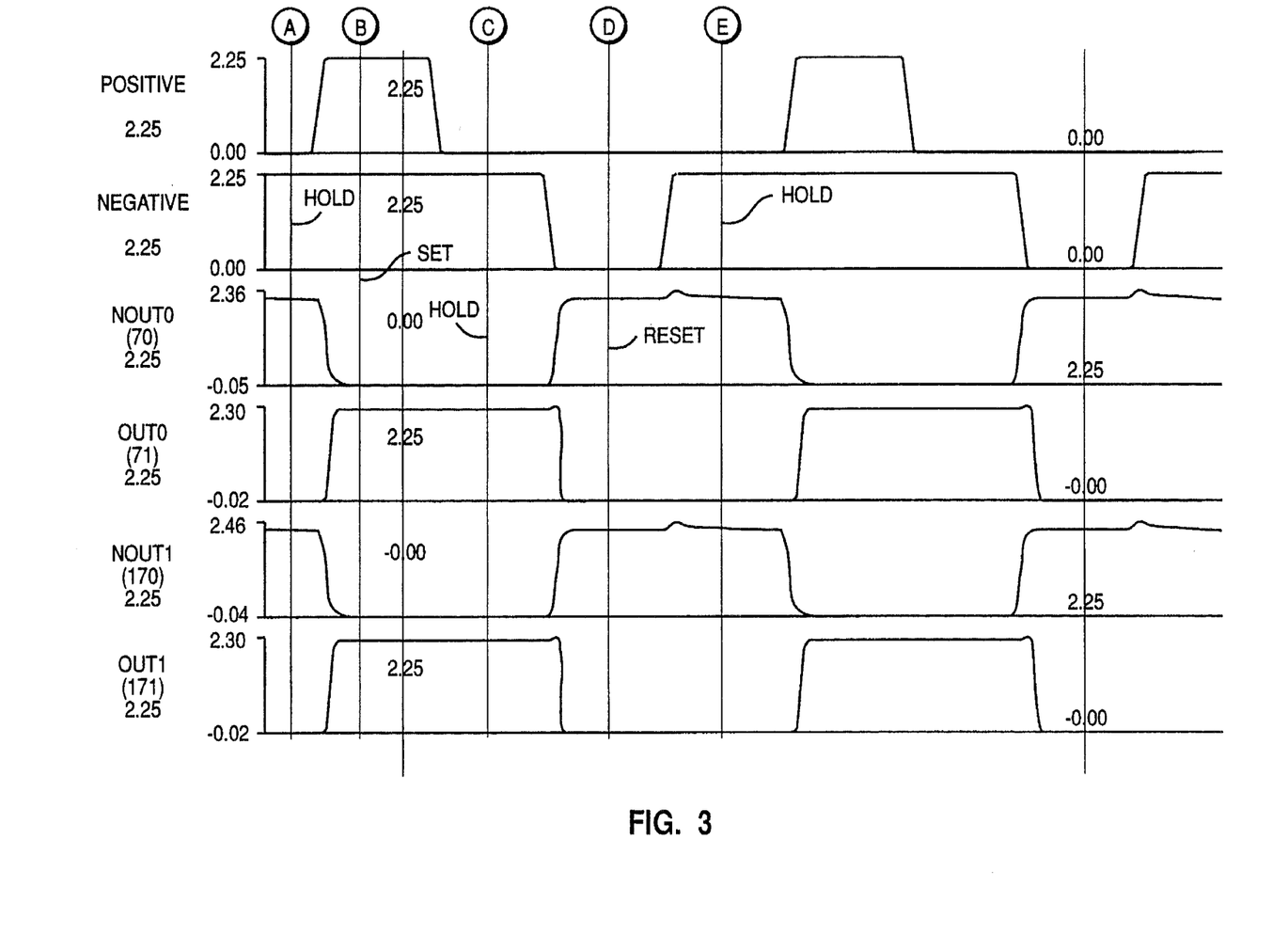
FIG. 3 is a timing diagram showing the wave forms for the circuits of FIGS. 1 and 2 when both inputs are not active at the same time (non-overlapping)
Figure 4:
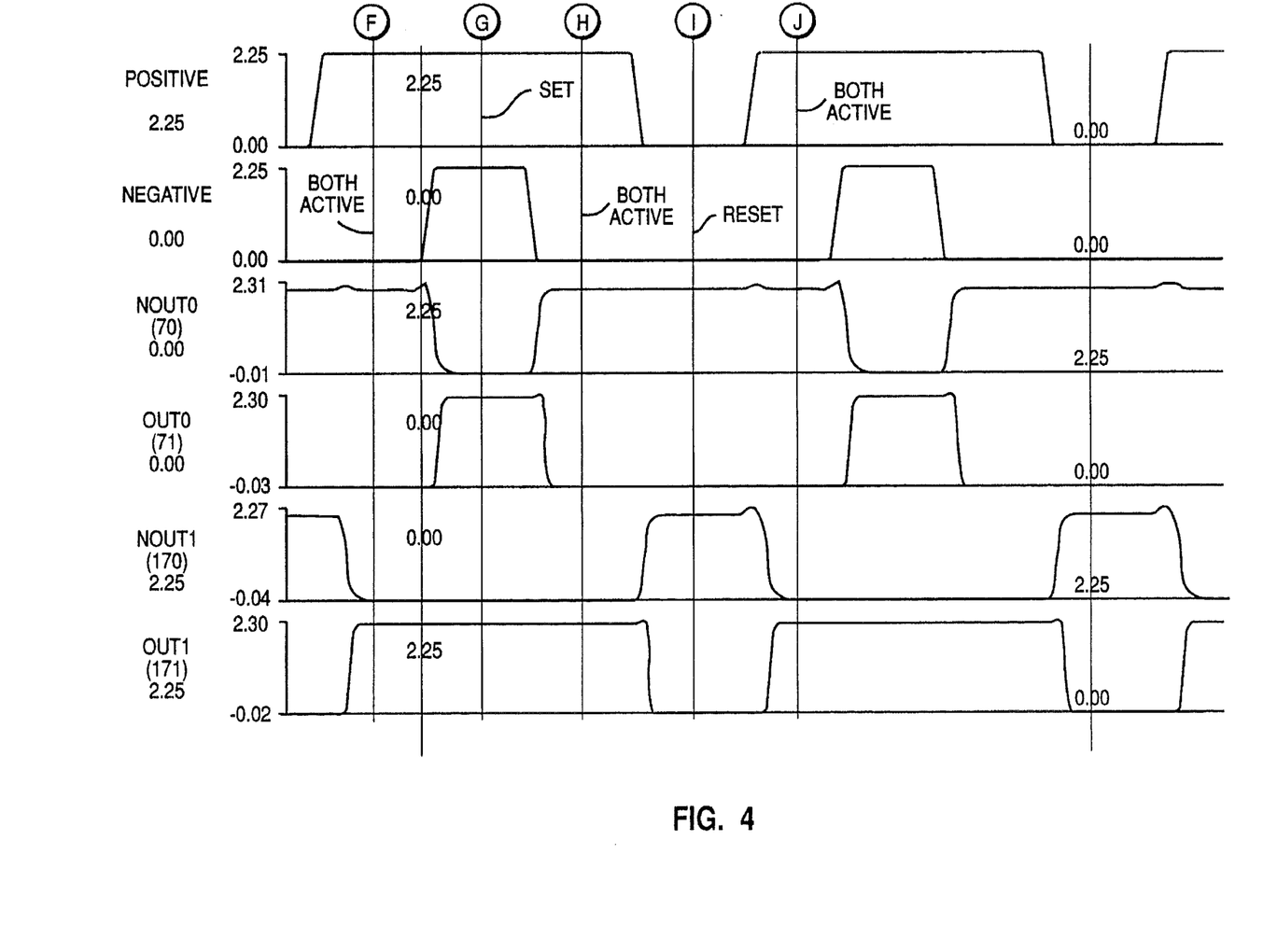
FIG. 4 is a timing diagram of the wave forms for the circuits of FIGS. 1 and 2 when both inputs are active (in an overlapped state)

Next, the circuit will be "set", at point B of FIG. 3 when the positive input goes high (becomes activated due to a voltage being applied). This causes each of the input nodes 1, 3 and 5 to have a "1" placed thereon. Thus, T36 and T34 will each conduct and cause node 70 to be at ground potential (logical "0"). The "0" is then input to circuit 40 which causes T42 to conduct and places Vdd on output 71. Therefore, a "1" is placed on output node 71 and T56 is on, and a "0" is on node 70. This causes the output node 71 to be set to a static level of "1", which is maintained until another triggering pulse is received by the pulse catcher from the dynamic circuit connected to input terminals 1, 3 and 5.

It can be seen at point C that the triggering edge for a positive active signal is the rising edge, where the voltage goes from the reference to Vdd (occurs between points A and B). Therefore, the circuit does not react to the falling edge of the positive active signal that occurs between point B and C. The event that will trigger a reset of the static signal output by node 71 is the leading edge of the negative active signal (falling edge where the voltage Vdd goes to the reference) that occurs between points C and D. At point C, the negative input to node 1 is a logical "1" and the input to positive nodes 3 and 5 are logical "0". The "1" at the negative input causes T36 to be turned on and T32 to be turned off. The "0" input to node 3 will not turn on T34, however, the "0" at node 5 will turn on T54. Prior to point C, output 71 is at a logical "1" which is provided to T56 and T52. T56 will conduct and node 70 will be at the reference potential ("0") due to conducting transistors T36 and T56. Node 71 will be maintained at "1" due to T42 electrically connecting Vdd with the output node. Thus, there is no change in the output of the circuit of FIG. 1 due to the trailing edge of the positive active pulse, i.e. the trailing edge will not reset the circuit.

However at point D, the circuit will be reset due to the leading edge of the negative active dynamic pulse input to node 1. The negative input to terminal 1 now a "0". In this case, all of the inputs to nodes 1, 3 and are "0". The "0" at node 1, causes T32 to conduct and node 70 is at the same voltage as Vdd, which is considered a logical "1". The "0" to node 3 does not turn on T34, but the "0" at node 5 will cause T54 to conduct. The "1" is input to T44 from node 70, causing it to be turned on and pull output node 71 to a logical "0". Thus, the circuit is "reset" at point D of FIG. 3 to a static level of "0" output at node 71. This static "0" will be maintained, by T44, T54 and T52 being turned on and in a stable state, and T42, T56 and T34 being turned off and in a stable condition, until the circuit is once again "set" by the leading edge of a positive active signal input to the pulse catcher.

Further, it can be seen that the rising edge of a negative active signal will not change the state of the output on nodes 70 and 71, i.e. the hold state is maintained. At point E, the negative active signal has become inactive, due to a logical "1" being placed on node 1. A logical "0" remains on nodes 3 and 5. In this case, the "1" at input node 1 causes T36 to be turned on. The "0" at node 3 causes T34 to remain off, while the "0" at node 5 will turn on T54. Output 71 has been a "0" and as such will keep T52 in a conductive state such that Vdd is provided to node 70 via transistors T52 and T54 to maintain it at logical "1". The "1" is provided to T44 and will cause node 71 to remain at ground potential (logical "0"). Therefore, the circuit of FIG. 1 will not change state when the trailing (rising) edge of a negative active pulse is received from a dynamic logic circuit on node 1.

Under normal conditions the dynamic logic pulses input to nodes 1, 3 and 5 will not both be active at the same time. This usually causes inconsistencies in the output of prior art pulse catchers, i.e. both the output node and the opposite of the output node may have the same value. However, the present invention addresses this problem by allowing a circuit designer to designate whether the negative active input or the positive active input will dominate the output of the pulse catcher by selecting between the circuits in FIGS. 1 and 2. It should be noted that the circuits of FIGS. 1 and 2 operate in the same manner when the inputs are not concurrently in an active state.

The operation of the circuit of FIG. 1 when both positive active and negative active inputs are in their active state will now be described in conjunction with FIG. 4. At point F, it can be seen that both the positive signal is active (logical "1") and the negative signal is active (logical "0"). In this case the input at node 1 will be a "0" and the input to nodes 3 and 5 will be a "1". The "0" input to node 1 will turn on T32 causing it conduct and node 70 to be at the potential of Vdd, or a logical "1" which is input to circuit 40. This turns on T44 pulling the output node 71 to ground potential (logical "0"). Thus a "0" is on node 71 and a "1" is on node 70. The circuit of FIG. 1 is designed to be a "negative dominant" circuit. That is, when both inputs are active the negative active signal will dominate the output. It can be seen that at point F the negative active signal causes the output node 71 to be in a negative state. In other words the signal at the output node 71 will follow the negative active input, as can be seen from FIG. 4.

At point G, the negative active input has become inactive, while the positive input remains active. This is the circuit "set" condition, as described above at point B of FIG. 3.

When the both the positive and negative dynamic inputs become active again, at point H, the negative dominance of the circuit of FIG. 1 is shown by the transition of the output node 71 to a logic "0". This circuit is then reset at point I in the manner as described above at point D of FIG. 3. At point J, the positive and negative inputs again both become active and the output 71 remains at a logical "0" in accordance with the negative dominant aspects of the circuit of FIG. 1.

Therefore, those skilled in the art will understand how the circuit of FIG. 1 will convert mixed positive active and negative active dynamic logic input signals to static logic, and also provide a consistent output even in the case when both inputs are active.

Figure 2:
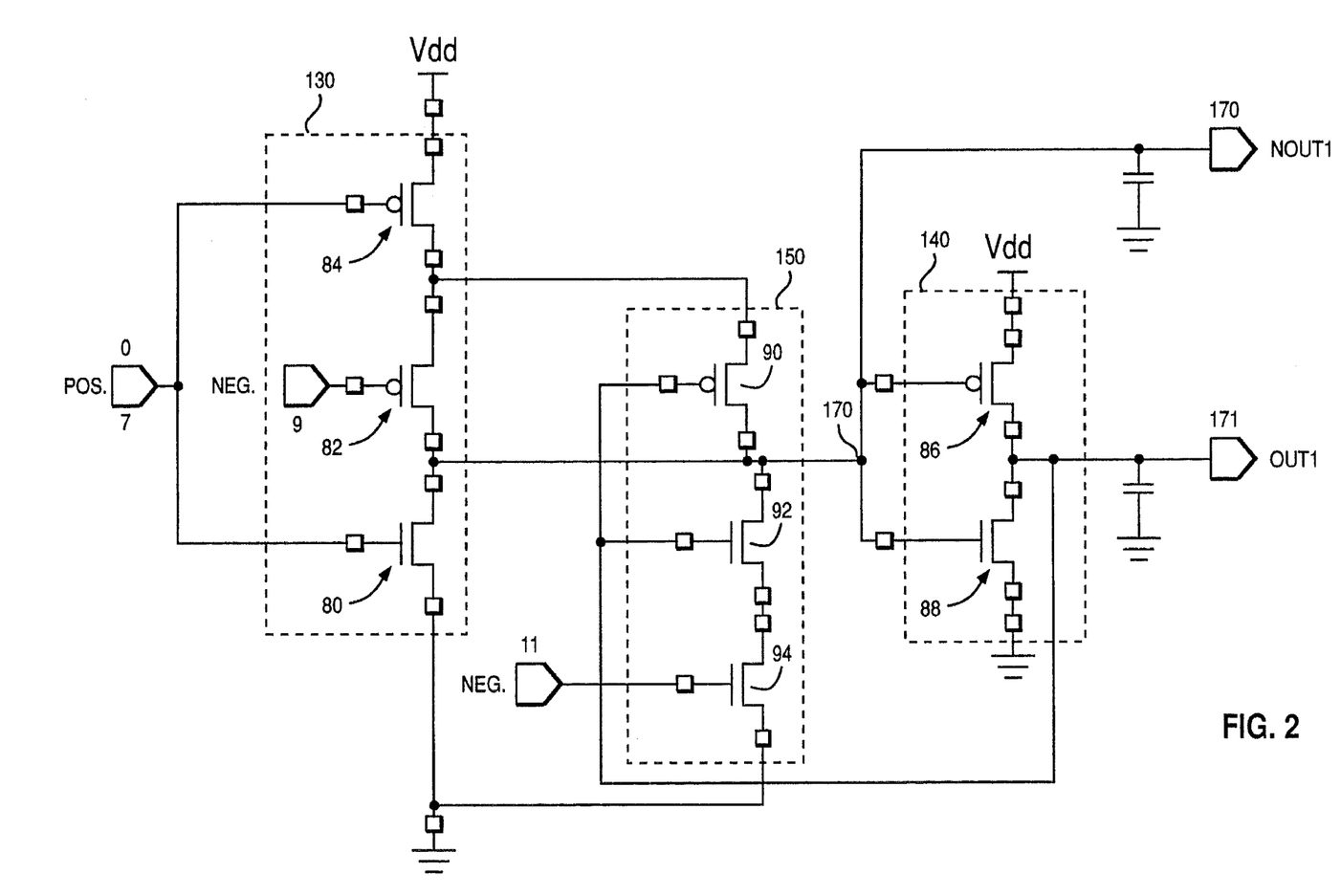
FIG. 2 is another schematic diagram of a pulse catcher circuit in which the positive active signal is dominant.

Referring to FIG. 2, another circuit embodying the present invention will now be described in conjunction with the timing diagrams of FIGS. 3 and 4.

FIG. 2 includes an input circuit 130 with P type transistors 82 and 84, along with N type transistor 80. A positive active signal is input to node 7 and then provides to transistors T80 and T84. An input node 9 receives a negative active dynamic logic signal which is then provided to transistor T82. A feedback circuit 150 is included with N type transistors T92 and T94, and P type transistor T90. Input node 11 receives the negative active signal and provides it to T94. Inverter circuit 140 includes P type transistor T86 and N type transistor T88. Circuit 140 outputs a signal on output node 171. This output signal is also provided to transistors T90 and T92. Node 170 is electrically connected to inverter circuit 140 such that the values on nodes 170 and 171 will always be opposite, i.e. node 170 will always be "not" the value on node 171. As discussed above with regard to the circuit of FIG. 1, the node 171 is considered to be the output of the pulse catcher circuit, however, those skilled in the art will understand how the same results could be obtained by considering node 170 as the output signal, with node 171 being the opposite value.

The operation of the pulse catcher circuit of FIG. 2 will now described in conjunction with the timing diagram of FIG. 3. At point A of FIG. 3, the positive active signal is inactive and the negative signal is inactive which means a "0" is input to node 7 and a "1" is input to nodes 9 and 11. The "0" at node 7 is provided to transistors T84 and T80 and turns on T84 since it is a P type device. The "1" at node 9 will not turn on T82 because it is a P type device. The "1" input at node 11 will turn on T94 as it is a N type device. In the present state of the pulse catcher circuit of FIG. 2, a "0" is present on output node 171. This "0" is provided to transistors T90 and T92, thus turning on T90. An electrically conductive path is then provided between Vdd and node 170 (through transistors T84 and T90) which causes node 170 to be at a logical "1". This "1" is input to T88 causing it to conduct and pull node 171 to ground potential, or logical "0". Therefore, the circuit maintains, or holds its state at "1" on node 170 and "0" on node 171.

At point B, the leading, or rising edge of the positive active signal has been encountered such that the positive signal is active and a "1" is input to node 7. The negative signal is still inactive and a "1" will also be input to nodes 9 and 11. In this case, the "1" will cause T80 to conduct and pull node 170 to ground potential ("0"). This "0" is then provided to circuit 140 and transistors T86 and T88. Since T86 is a P type device, node 171 will be at Vdd and a logical "1" is present on the output node. In this manner, the pulse catcher of FIG. 2 is "set" and outputs a static logic level, based on the dynamic logic input pulse, due to the triggering edge of the positive active signal. The static output of the circuit of FIG. 2 will remain in this "set" state until the leading edge of the negative active signal is encountered.

At point C, the falling edge of the positive active pulse has been encountered, but there is no change in the state of the output of the pulse catcher circuit. More particularly, at point C a "0" is input to node 7 and a "1" is input to nodes 9 and 11. The "0" input to node 7 will cause T84 to conduct. The "1" at node 9 will have no affect, because T82 is a P type device and is turned on by the absence of a signal. At node 11, the "1" will cause T94 to be turned on. The output of node 171 is a "0", which is provided to transistors T90 and T92 which will cause T90 to conduct such that a conductive path is provided between Vdd and node 170. Thus, node 170 will be held at "1". Transistor T88 will receive this logical "1" and conduct, thereby causing the output node 171 to be pulled to ground potential, or logical "0". Thus, it can be seen that a "1" is held at node 170 and a "0" is maintained on node 171 at the point in time noted by reference C.

However, at point D the leading, or falling, edge of the negative active signal has been encountered such that the circuit of FIG. 2 will be "reset". In this state, a "0" is input to each of nodes 7, 9 and 11. The "0" at node 7 will cause T84 to be turned on and conduct. The "0" at node 9 will also turn on P type device T82 such that node 170 will then be pulled to the potential of Vdd through transistors T82 and T84. It can be seen that the value at node 170 has changed from a "0" to "1" due to the leading edge of the negative active dynamic logic signal input to the pulse catcher of FIG. 2. The "0" input to node 11 will not turn on T94, since it is a N type device. The "1" on node 170 is provided to T88 which is then turned on a pulls node 171 to ground potential causing it to be a logical "0". Thus, the value at the output node 171 has been reset to a "0" in accordance with the present invention, and as shown in FIG. 3.

A rising edge (trailing) of the negative active signal has been encountered at point E of FIG. 3. In this instance, there will be no change in the output of the pulse catcher since it is in a hold state. A logical "0" is still input to node 7, but a logical "1" is now input to nodes 9 and 11. The "0" input to node 7 will cause T84 to be turned on and conduct. However, the "1" at node 9 will not turn on transistor 82. The "1" at node 11 will cause T94 to conduct. Since a "0" was present on node 171 in the previous time period, it will have been provided to T90 which keeps it in a turned on state. Thus, transistors T84 and T90 provide a conductive path between Vdd and node 170 and a logical "1" will be held thereon. Further, since a "1" is still input by node 170 to T88, this transistor will be in a conductive state and maintain a "0" (ground potential) on node 171. Thus, it can be seen that the output of the pulse catcher will not change state between points D and E. That is, the rising edge of the negative active signal as no affect on the state of the output of the circuit of FIG. 2.

It can be seen from FIG. 3 that the outputs 71 and 171 (and the opposite output values on node 70 and 170) will be identical for each embodiment of the pulse catcher circuits in FIGS. 1 and 2 for the input stimulus shown in FIG. 3.

Next, the pulse catcher circuit of FIG. 2 will be described in conjunction with the timing diagrams of FIG. 4. Again, FIG. 4 addresses the situation where both of the dynamics inputs to the pulse catcher circuit are in their active state. At point F, the positive and negative dynamic input signals are in their active state, i.e. a "1" is input at node 7 and a "0" is input to nodes 9 and 11. In the circuit of FIG. 2, the "1" at node 7 will cause T80 to conduct, thereby pulling node 170 to ground ("0"). This "0" is input to T86, thus turning it on and causing Vdd to present on node 171. Therefore, a logical "1" is on the output node 171 and a "0" is on node 170. It can be seen that for the pulse catcher of FIG. 2, the positive input signal will be dominant, i.e. the output node 171 will be at a positive level ("1") when the positive active input signal is in its active state.

At point G, the positive input signal remains active, but the negative signal has become inactive. This case is similar to point B, where the circuit of FIG. 2, is set. In particular, at point B a "1" is input on node 7 and a "1" is also input to nodes 9 and 11. The "1" at node 7 will continue to cause T80 to conduct and keep node 170 at "0", thereby keeping a "1" on output node 171 in accordance with the timing diagram of FIG. 4.

At point H, the positive input remains active and the negative input is once again activated. This activation of the negative input signal will not change the output on nodes 170 and 171. The "1" input to node 7 will keep T80 turned on and maintain node 170 at "0" (ground potential). Correspondingly, node 171 will be at a "1" due to the conductive state of T86. It can be seen that changing the state of the negative active input will have no affect on the state of the static signal output at node 171. By comparison, changing the state of the positive input to the circuit of FIG. 1 will have no affect on the state of the output at node 71.

However, at point I the positive input signal at node 7 has been deactivated. This "0" on node 7 causes T84 to be turned on and T80 to be turned off. Additionally, the input to node 9 is a "0" which will cause T82 to conduct and Vdd is now electrically connected to node 170 causing it to be at a logical "1". Further, the "1" on node 170 causes T88 to conduct and pull the potential at node 171 to ground (logical "0"). In this case, the static output node 171 has followed the positive input signal by becoming inactive (at logical "0") during the same period when the positive active input signal is deactivated.

The positive input signal then goes active at point J and the output at point 171 follows the positive input signal and also becomes active. That is, the logical "1" at node 7 will again cause T80 to conduct bringing node 170 to ground ("0"). The transistor T86 is then turned on causing node 171 to be at Vdd ("1") in accordance with the timing diagram of FIG. 4.

Therefore, it can be seen how the pulse catcher of FIG. 1 is considered negative dominant wherein the output and node 71 follows the negative active dynamic logic input signal. And, the pulse catcher of FIG. 2 is a positive dominant circuit with an output that follows the positive active dynamic logic input signal. In both cases there is no inconsistency in the static output on nodes 71 and 171 when both of the dynamic logic input signals are in their active state. Further, there will also not be any "fighting" between weak and strong components in the circuit that could cause a resistive path between power (Vdd) and ground. In this manner, a logic designer has the flexibility of using either the negative or positive dominant pulse catcher circuits depending on the application.

Both embodiments of the pulse catcher of the present invention are fully tunable in that the values of the transistors can be altered to cause the transition time required for the circuit to be set or reset to be minimized. By modifying the relative strength of transistor T32 versus transistors T34 and T36 in the pulse catcher of FIG. 1, and modifying the value of transistor T80 with respect to T82 and T84 (in the circuit of FIG. 2), the delay for the signal and triggering edge at the inverted output can be optimized, i.e. nodes 71 and 171. If the relative strength of transistor T42 relative to T44 (pulse catcher of FIG. 1), and the strength of transistor T88 versus T86 are modified a similar optimization will occur at the noninverting output, i.e. nodes 70 and 170.

Figure 5:
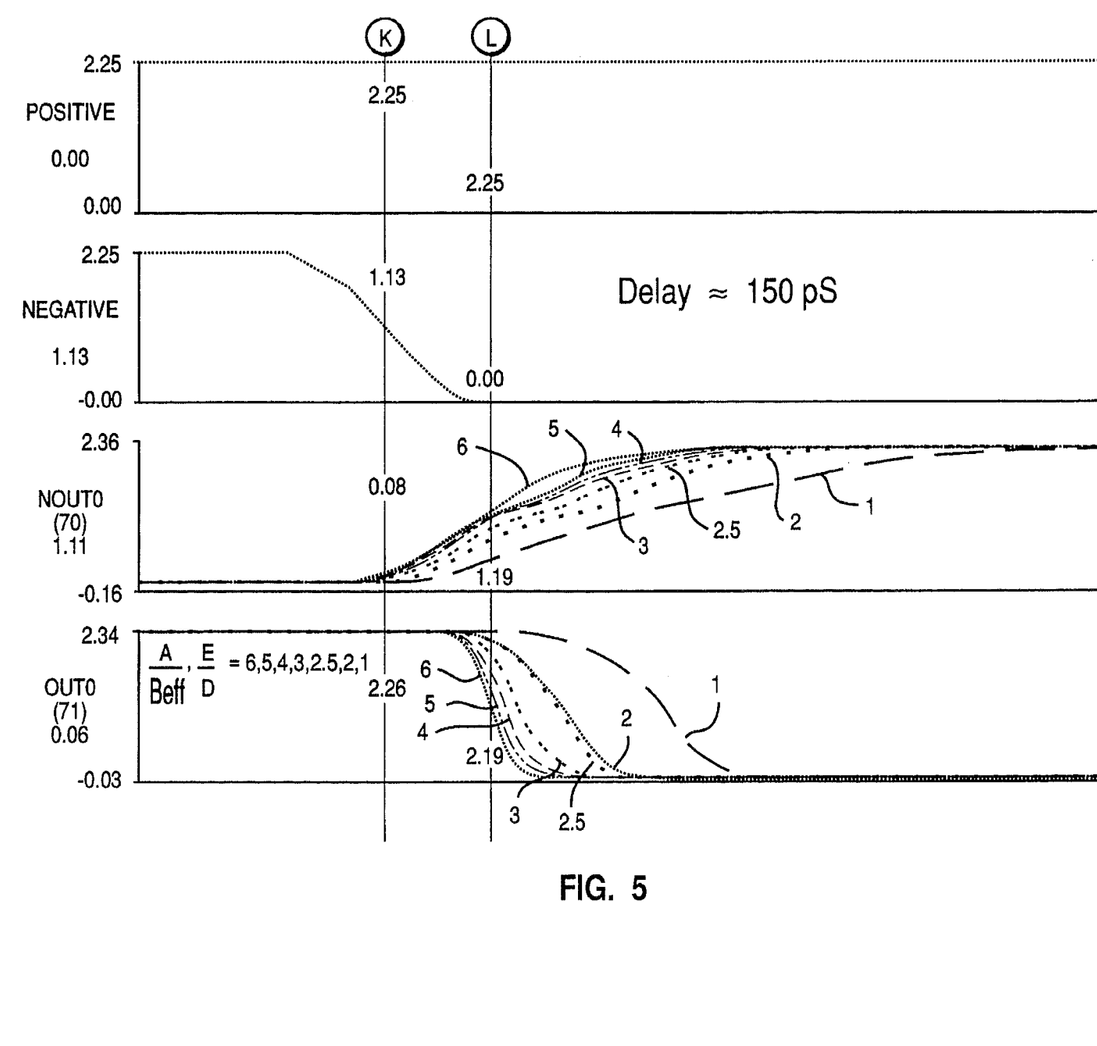
FIG. 5 is a chart showing a simulation of the pulse catcher of FIG. 1 reacting to its dominant input becoming active for various ratios of transistor values.

FIG. 5 shows a simulation of the pulse catcher of FIG. 1 reacting to the activation of the negative input signal. It will be recalled that the pulse catcher of FIG. 1 is negative dominant and will change its output state in accordance with the state of the negative active input. At point K the negative signal is activated and the output node 71 follows this activation at point L. For the circuit of FIG. 1, the ratio of the value of transistor T32 to the effective combined value of transistors T34 and T36, is multiplied by the ratio of transistor T44 to T42 to obtain a response value. The response time of the circuit of FIG. 1 at the response values of 6, 5, 4, 3, 2.5, 2 and 1 are plotted and shown in FIG. 5. It can be seen that a response value of 6 will provide the fastest response and shortest delay, i.e. the larger the number in FIG. 5, the faster the response of the circuit. However, the transistor values used to obtain this response time will also make the circuit less resistant to noise. Therefore, the circuit designer is presented with several choices to optimize the circuit, depending on the specifics of the system being designed.

Figure 6:
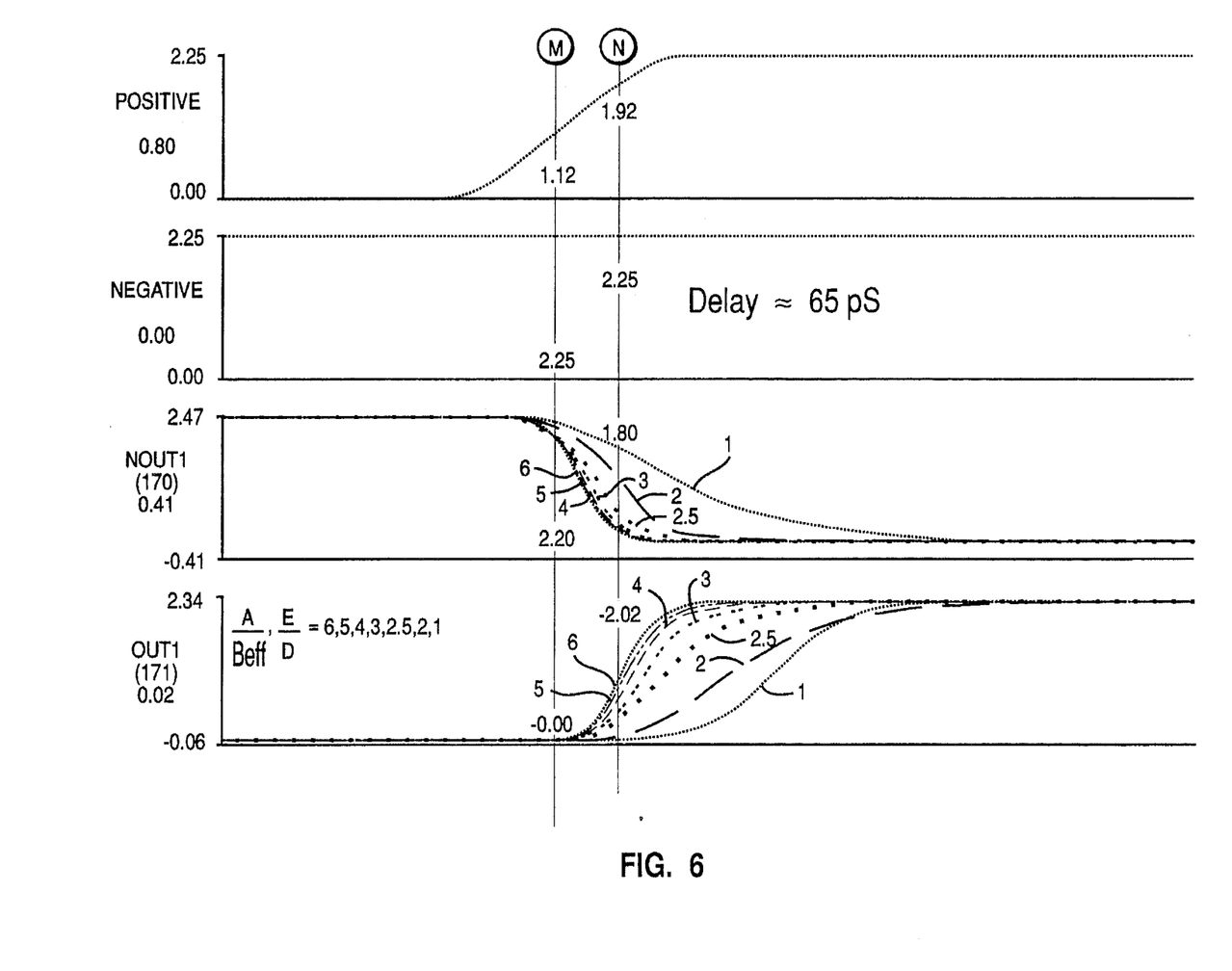
FIG. 6 is a chart of a simulation of the pulse catcher of FIG. 2 reacting to its dominant input going active at various transistor values.

Similarly, FIG. 6 is a timing diagram showing a simulation of the response time for the pulse catcher circuit of FIG. 2 when it is reacting to the activation of the positive input signal. The pulse catcher of FIG. 2 is positive dominant and will change its output state in accordance with the state of the positive active input. At point M the positive signal is activated and the output node 171 follows this activation at point N. For the circuit of FIG. 2, the ratio of the value of transistor T80 to the effective combined value of transistors T82 and T84, is multiplied by the ratio of transistor T86 to T88 to obtain a response valise. The response time of the circuit of FIG. 2 at the response values of 6, 5, 4, 3, 2.5, 2 and 1 are plotted and shown in FIG. 5. Again, a response value of 6 will provide the fastest response and shortest delay. Therefore, those skilled in the art can see how the pulse catcher circuits of the present invention are fully tunable and will provide a great deal of flexibility to circuit designer.

Additionally, the feedback circuits 50 (transistors T52, T54, T56) and 150 (transistors T90, T92, T94) can be sized to resist the coupling noise placed on nodes 70, 71, 170 and 171 by external sources, such as the previously noted clock circuit. By the making the components "stronger" (higher values) then the circuit becomes more noise resistant, but there is a tradeoff in that the circuit becomes slower to respond to input stimulus.

Although certain preferred embodiments have been shown and described it should be understood that many changes and modifications may be made therein without departing from the scope of the appended claims.

I claim:

1. A system which converts logic pulses to static logic levels, comprising:

means for simultaneously receiving positive active and negative active logic pulses;

first means for outputting a positive static logic level when said positive active logic pulse is received and a negative static logic level when said negative active logic pulse is received, and for setting said static logic level to a positive value when a leading edge of said positive active pulse is received and maintaining said static logic level at said positive value until a leading edge of said negative active pulse is received; and second means for outputting said positive static level or said negative static level when both said positive active and said negative active pulses are received.

2. A system according to claim 1 wherein said first means further comprises:

means for resetting said static logic level to a reference value when the leading edge of said negative active pulse is received; and means for maintaining said static logic level at said reference value until the leading edge of said positive active pulse is received.

3. A system according to claim 2 wherein said second means comprises:

means for setting said static logic level to the positive value when the trailing edge of said negative active pulse is received; and means for maintaining said static logic level at said positive value until the leading edge of said negative active pulse is received.

4. A system according to claim 3 wherein said second means further comprises:

means for setting said static logic level to the positive value when the leading edge of said positive active pulse is received; and means for maintaining said static logic level at said positive value until the trailing edge of said positive active pulse is received.

5. A method for converting logic pulses to static logic levels, comprising the steps of:

simultaneously receiving positive active and negative active logic pulses;

outputting a positive static logic level when said positive active logic pulse is received and a negative static logic level when said negative active logic pulse is received by setting said static logic level to a positive value when a leading edge of said positive active pulse is received and maintaining said static logic level at said positive value until a leading edge of said negative active pulse is received; and providing said positive static level or said negative static level when both said positive active and said negative active pulses are received.

6. A method according to claim 5 wherein said step of outputting further comprises the step of:

resetting said static logic level to a reference value when the leading edge of said negative active pulse is received; and maintaining said static logic level at said reference value until the leading edge of said positive active pulse is received.

7. A method according to claim 6 wherein said step of providing comprises the steps of:

setting said static logic level to the positive value when the trailing edge of said negative active pulse is received; and maintaining said static logic level at said positive value until the leading edge of said negative active pulse is received.

8. A method according to claim 7 wherein said step of providing further comprises the steps of:

setting said static logic level to the positive value when the leading edge of said positive active pulse is received; and maintaining said static logic level at said positive value until the trailing edge of said positive active pulse is received.

* * * * *